(12) United States Patent
Baker et al.

(10) Patent No.: US 6,400,188 B1
(45) Date of Patent: Jun. 4, 2002

(54) TEST MODE CLOCK MULTIPLICATION (75) Inventors: William G. Baker, Starkville; Jeffrey W. Gossett, Columbus, both of MS (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/608,279

(22) Filed: Jun. 30, 2000

(51) Int. Cl.[7] .............................................. H03K 17/00
(52) U.S. Cl. ......................................... 327/99; 365/201
(58) Field of Search .......................... 327/94, 141, 407, 327/99, 117; 365/201; 371/22.5

(56) References Cited

U.S. PATENT DOCUMENTS

| 5,453,993 A | * | 9/1995 | Kitaguchi et al. | ......... 371/22.5 |
| 5,821,786 A | * | 10/1998 | Nozuyama et al. | ......... 327/141 |
| 6,058,056 A | * | 5/2000 | Beffa et al. | .................. 365/201 |
| 6,075,392 A | * | 6/2000 | Sandner | ........................ 327/99 |

OTHER PUBLICATIONS

William G. Baker, Majority Vote Circuit for Test Mode Clock Multiplication, Serial No. 09/609,192, Filed Jun. 30, 2000.

* cited by examiner

*Primary Examiner*—Dinh T. Le
(74) *Attorney, Agent, or Firm*—Christopher P. Maiorana, P.C.

(57) ABSTRACT

A circuit configured to generate an output clock signal generally having (i) a first frequency when in a first mode and (ii) a second frequency when in a second mode, in response to a plurality of signals. A delay of the output clock signal may be identical when operating in either the first mode or the second mode.

19 Claims, 7 Drawing Sheets

FIG. 1
(CONVENTIONAL)

TEST MODE CLOCK MULTIPLICATION

CROSS REFERENCE TO RELATED APPLICATIONS

The present application may relate to co-pending application Ser. No. 09/609,192, filed Jun. 30, 2000, which is hereby incorporated by reference in its entirety.

FIELD OF THE INVENTION

The present invention relates to a method and/or architecture for clock multiplication generally and, more particularly, to a method and/or architecture for clock multiplication in a test mode.

BACKGROUND OF THE INVENTION

Conventional approaches for generating a test clock frequency are limited. A required test clock frequency can be higher than the maximum frequency that conventional production testers are capable of generating. However, the production testers are able to generate other necessary test inputs (i.e., enables, clears, test data, etc.).

Figure 1:
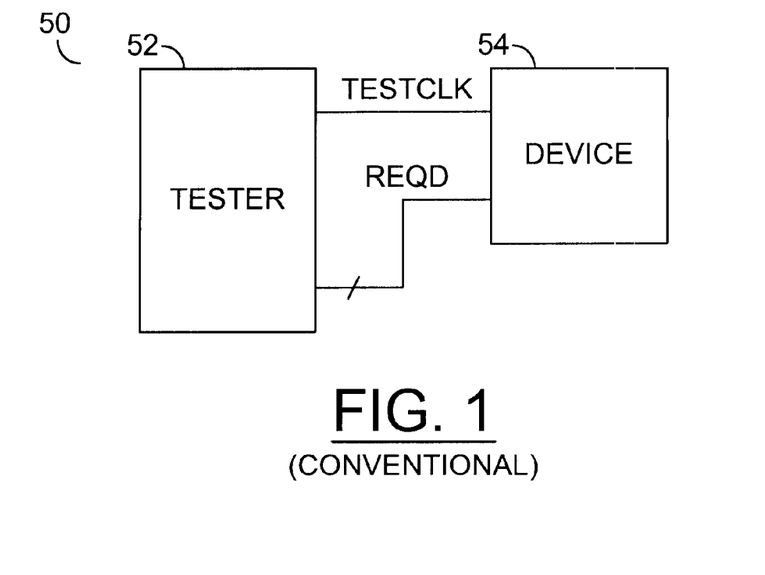
FIG. 1 is a block diagram of a conventional production tester implementation.

Referring to FIG. 1, a block diagram of a circuit 50 is shown illustrating an example tester implementation. The circuit 50 comprises a tester 52 and a device 54. The tester 52 is configured to generate a test clock TESTCLK and the number of required signals REQD. The test clock signal TESTCLK and the signals REQD are presented to the device 54. The clock signal TESTCLK and the signals REQD are implemented to perform tests of the device 54. However, the tester 52 is not capable of generating a high enough frequency to test some devices. For example, a fast synchronous part (such as a RAM) requires a higher test clock frequency than the tester 52 can generate.

A conventional approach for generating a high frequency test clock implements a one-shot circuit triggered by both rising and falling input clock edges. Such a one-shot circuit provides on-chip clock doubling. The timing of a first edge of the internal clock is set by an internal delay path, and thus the first edge cannot be controlled by an external signal. Additionally, the behavior of the clock doubling circuit is typically not the same for the test (i.e., doubling) mode and the normal mode. For example, the first cycle of the internal clock is triggered by a rising edge of the external clock, while the next cycle is triggered by a falling edge of the external clock. The one-shot circuit requires precise control of rising and falling edges of the external clock to achieve constant internal clock frequency. If a device function depends upon a minimum or maximum internal clock high (i.e., active) or low (i.e., non-active) time, this on-chip clock doubling approach may not be adequate.

Another conventional approach for generating a high frequency test clock implements on-chip clocked OR gate testers pulsed alternately in response to external clocks. Two external clocks are alternately pulsed, and internally ORed to generate an increased internal frequency (i.e., test) clock. A high time (i.e., active high) of the internal test clock is nearly the same as a high time (active high) of the external clock. Thus, narrow pulse widths (i.e., high frequency) on the two clock inputs is required to increase the frequency of the internal test clock. However, the required narrow pulse widths (and corresponding high frequency) can exceed tester limitations.

It is generally desirable to provide a method and/or architecture that may provide a clock multiplication scheme that may maintain a constant delay from a number of input clock signals to an output clock signal and control over rising and falling edges of the output clock signal.

SUMMARY OF THE INVENTION

One aspect of the present invention concerns a circuit configured to generate an output clock signal generally having (i) a first frequency when in a first mode and (ii) a second frequency when in a second mode, in response to a plurality of signals. A delay of the output clock signal may be identical when operating in either the first mode or the second mode.

Another aspect of the present invention concerns a circuit configured to generate an output clock signal generally having (i) a first frequency when in a first mode and (ii) a second frequency when in a second mode, in response to a plurality of signals. At least one of the plurality of signals may comprise an identical signal path while in the first mode and the second mode.

The objects, features and advantages of the present invention include providing a method and/or architecture for test mode clock multiplication that may (i) reduce an external clock frequency required to test a device, (ii) allow all clock inputs in a test mode to be correlated with a clock input in a normal mode, (iii) allow implementation of cheaper production test equipment, (iv) reduce a required tester frequency, while maintaining control over all internal clock edges, (v) allow external control over all edges of an internal clock in a test mode, (vi) provide identical paths for a clock input in a normal and/or a test mode, (vii) allow control of an internal clock, (viii) allow timing from an input to be independent of remaining inputs, (ix) allow all clock inputs in a test mode to be correlated with the clock inputs in a normal mode, (x) implement a multiple input vote circuit to generate a higher frequency clock, (xi) provide a multiple input circuit that may allow a delay from any input to an output to be independent of a state of another input, (xii) enable testing of fast parts using existing testers, (xiii) provide a multiple input circuit that may allow a delay from any input to an output to be independent of a state of the remaining inputs, (xiv) provide a multiple input vote circuit that may have identical timing from any input to an output when one of the inputs carries a deciding vote and/or (xv) reduce production costs.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
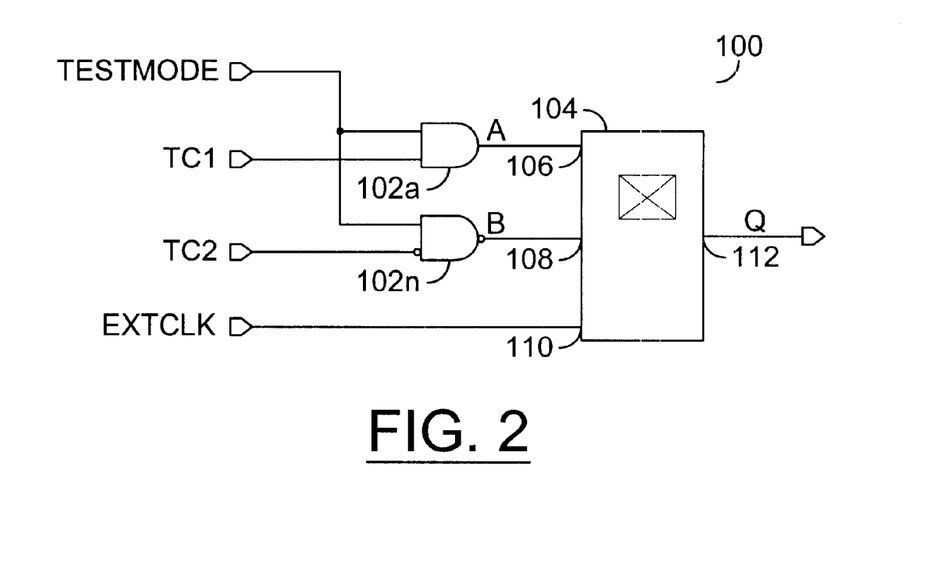
FIG. 2 is a block diagram of a preferred embodiment of the present invention.

Referring to FIG. 2, a block diagram of a circuit 100 is shown in accordance with a preferred embodiment of the present invention. The circuit 100 may be implemented as a test mode clock multiplication circuit configured to generate an internal high frequency clock (e.g., test clock). The circuit 100 may allow a tester device to test another device with a higher clock frequency than the tester may be directly capable of generating. The circuit 100 may provide a predetermined mode (e.g., a test mode) that may internally increase a frequency of an input clock (e.g., an external clock). Additionally, the circuit 100 may provide a predetermined mode (e.g., a normal mode) that may provide a normal clock output. The circuit 100 may allow testing of synchronous devices implementing testers that are generally less expensive than full rate high frequency testers.

The circuit 100 may provide a test mode to generate a high frequency internal clock signal from lower frequency inputs. Additionally, the circuit 100 may operate in a normal mode and a test mode. In the test mode, the internal clock signal may be generated by a majority vote circuit driven by a number of signals. In the normal mode, the internal clock signal may be generated by a majority vote circuit driven by an external clock input signal. However, the circuit 100 may implement another appropriate type device to drive the internal clock signal when in the normal and test modes of operation. The signal path from the external clock input to the internal clock may be essentially identical in the normal mode and the test mode. Furthermore, the circuit 100 may enable correlation of the internal clock in the test mode and in the normal mode.

The structure of the circuit 100 generally comprises a number of gates 102a–102n (where n an integer) and a multi-input block (or circuit) 104. In one example, the multi-input circuit 104 may be implemented as a majority vote circuit (MVC). In another example, the multi-input circuit 104 may be implemented as a block of logic implementing a truth table. However, the multi-input circuit 104 may be implemented as another appropriate type device in order to meet the criteria of a particular implementation.

The gate 102a is shown implemented as a AND gate and the gate 102n is shown implemented as a gate with one inverted input and an inverted output. For example, the gate 102n may be implemented as NAND gate and an inverter before one input. However, the gates 102a–102n may be implemented as other appropriate type logic gates in order to meet the design criteria of a particular implementation. Furthermore, a particular number of gates 102a–102n may also be varied in order to meet the criteria of a particular implementation.

The gate 102a may have a first input that may receive a signal (e.g., TESTMODE) and a second input that may receive a signal (e.g., TC1). The gate 102n may have a first input that may receive the signal TESTMODE and a second, inverted, input that may receive a signal (e.g., TC2). In one example, the signals TC1 and TC2 may each be implemented as a test clock signal. In another example, the signal TESTMODE may be implemented as a test mode indication signal. However, the signals TC1, TC2 and TESTMODE may each be implemented as other appropriate type signals in order to meet the criteria of a particular implementation. Furthermore, the circuit 100 may be configured to receive another appropriate number of clocks and/or signals in order to meet the criteria of a particular implementation.

The gate 102a may present a signal to an input 106 (e.g., A) of the circuit 104. The gate 102n may present a signal to an input 108 (e.g., B) of the circuit 104. The circuit 104 may also have an input 110 (e.g., C) that may receive an external clock signal (e.g., EXTCLK). The external clock signal EXTCLK may be implemented to clock the majority vote circuit 104 during a normal mode, as well as a test mode of operation. Additionally, the circuit 104 may have an output 112 (e.g., Q) that may present a signal (e.g., INTCLK). In one example, the signal INTCLK may be implemented as an internal clock. In another example, the signal INTCLK may be implemented as a high frequency test clock. The clock signal INTCLK may be presented to an external device (not shown).

The circuit 104 may enable typical production test equipment to test devices with higher clock frequencies than the test equipment may be normally capable of directly generating. For example, the test clock signal INTCLK may be presented to an external device (not shown) to be tested. The signal INTCLK may provide a high frequency test clock to the external device. The signal INTCLK may have a higher frequency than the clock EXTCLK. In one example, the circuit 100 may provide a test mode that may internally triple the frequency of the clock EXTCLK by implementing the test clocks TC1 and TC2. However, other frequency multiplication factors (e.g., 4×, 5×, 6×, etc.) may be implemented accordingly to meet the design criteria of a particular implementation. The majority vote circuit 104 may generate the clock signal INTCLK in response to the signals TC1, TC2 and EXTCLK. The majority vote circuit 104 may guarantee, by design, that a delay (e.g., timing) of the internal clock signal INTCLK to the external clock EXTCLK is identical (or nearly identical) in the normal mode and the test mode.

The circuit 100 may provide a delay from the external clock signal EXTCLK to the internal clock signal INTCLK in the test mode that may be identical to a delay in the normal mode. For example, the delay from a rise of the external clock signal EXTCLK to a rise of the internal clock signal INTCLK may be invariant to the particular mode (e.g., test mode or normal mode). Similarly, the delay from a fall of the external clock signal EXTCLK to a fall of the internal clock signal INTCLK may be invariant to the mode. The circuit 100 may allow rising edge delays of the signal INTCLK to match falling edge delays of the signal INTCLK via the signals TC1, TC2 and EXTCLK. Additionally, the circuit 100 may match delays from the test clock input signals TC1 and TC2 with the delay from the external clock signal EXTCLK.

The circuit 100 may provide the test mode to generate a high frequency test clock (e.g., INTCLK) from a number of lower frequency inputs (e.g., the clocks TC1, TC2 and EXTCLK). In the test mode, the majority vote circuit 104 may generate the internal clock signal INTCLK. During the test mode, the majority vote circuit 104 may allow the internal clock signal INTCLK to be driven by the clock and/or signals received at the input A, the input B and/or the input C. However, during the normal mode the internal clock INTCLK may be driven by the signal at the input C (e.g., the external clock EXTCLK).

The majority vote circuit 104 may have an identical signal path in the normal mode and the test mode. The circuit 104 may provide an identical signal path of at least one of the inputs A, B and/or C to the output Q. For example, the signal path from the external clock EXTCLK (e.g., input C) to the internal clock INTCLK (e.g., output Q) may be identical in the normal mode and the test mode. The identical signal path may enable correlation of the internal clock INTCLK in the test mode to the internal clock INTCLK in the normal mode.

The clock signal EXTCLK may be received, in one example, from a tester. The circuit 100 may allow for a test mode and normal mode to be controlled and clocked on-chip. When the signal TESTMODE is true (e.g., ON or "high"), the internal clock signal INTCLK is generally determined by a majority vote of the external clock signal EXTCLK and the test clocks TC1 and TC2. When the signal TESTMODE is false (e.g., OFF or "low"), the input A of the majority vote circuit 104 is generally forced to false and the input B is forced to true, so the external clock EXTCLK may have the deciding vote (e.g., clocking of the signal INTCLK). In one example, all three clock inputs A, B and C paths may be non-inverting. Thus, rising edges of internal clock INTCLK may be caused by external rising edges of the clock EXTCLK. The falling edges of the internal clock INTCLK may respond similarly to the falling edges of the signal EXTCLK.

The circuit 100 may implement the majority vote circuit 104 in a variety of ways (to be described in more detail in connection with FIGS. 3–13). Alternate implementations of the clock multiplication circuit 100 may include gating of the input clock signals TC1, TC2 and EXTCLK with the signal TESTMODE. Several alternate implementations, such a test mode clock multiplying circuit and multiple input circuit, may be presented as described below.

Figure 3:
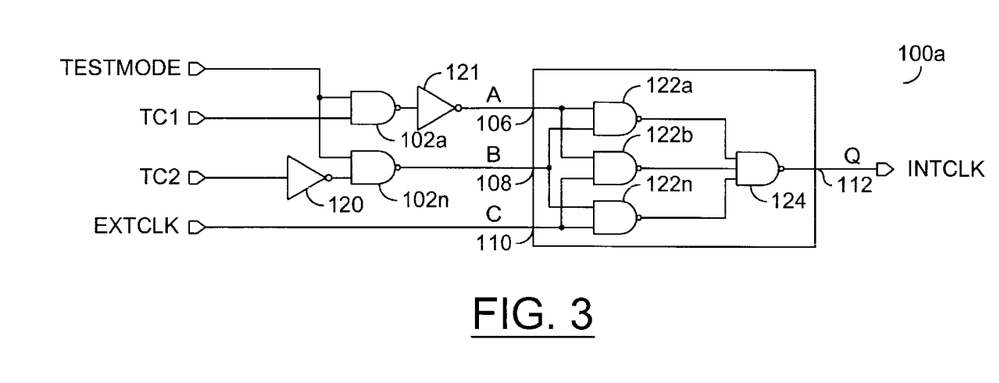
FIG. 3 is a detailed block diagram of the circuit of FIG. 2.

Referring to FIG. 3, a detailed diagram of a circuit 100a is shown. The circuit 100a may be similar to the circuit 100. Additionally, a detailed block diagram of a multi-input circuit 104 is shown. The multi-input circuit 104 may be implemented, in one example, as a three input majority vote circuit. Additionally, the clock multiplication circuit 100a may illustrate an NAND implementation of the circuit 100. The gate 102a may be implemented as an NAND gate. An inverter 120 may be coupled to the second input of the gate 102n and an inverter 121 may be coupled to the output of the gate 102a. The multi-input circuit 104 is implemented as a number of NAND gates 122a–122n (where n is an integer) and a NAND gate 124. However, the gates 122a–122n and 124 may be implemented as other appropriate type logic gates in order to meet the design criteria of a particular implementation. During the normal mode of operation the gate 122n may clock the internal clock INTCLK. However, the gate 122n may not allow precise timing between the normal mode and the test mode. The multi-input circuit 104 of the clock multiplication 10a may not provide precisely matched clock edges for normal and test mode clocks.

Figure 4:
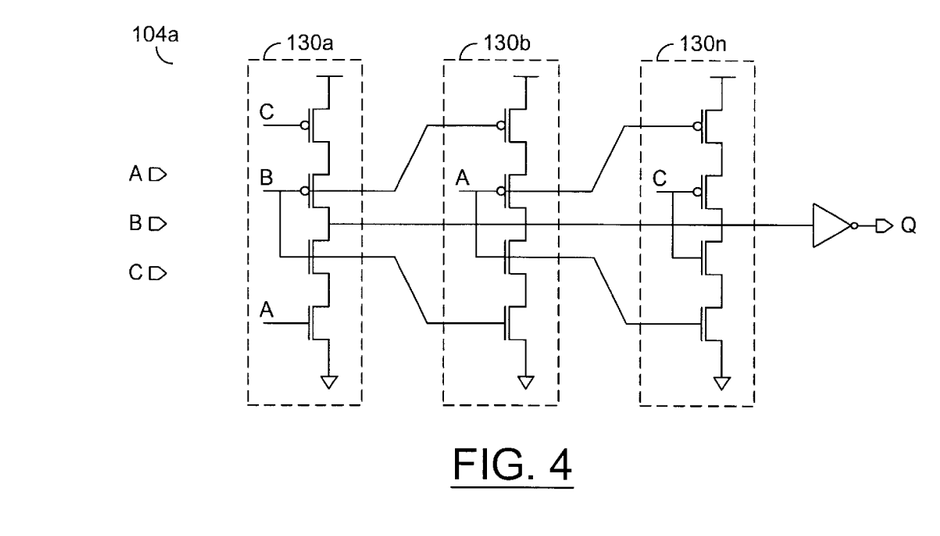
FIG. 4 is a schematic of an alternate embodiment of the present invention illustrates a multi-input circuit.

Referring to FIG. 4, schematic of a circuit 104a is shown in accordance with an alternate embodiment of the present invention. The multi-input circuit 104a is shown comprising a number of transistor blocks 130a–130n. The circuit 104a may be implemented as a three input majority vote circuit having different signal paths.

Figure 5:
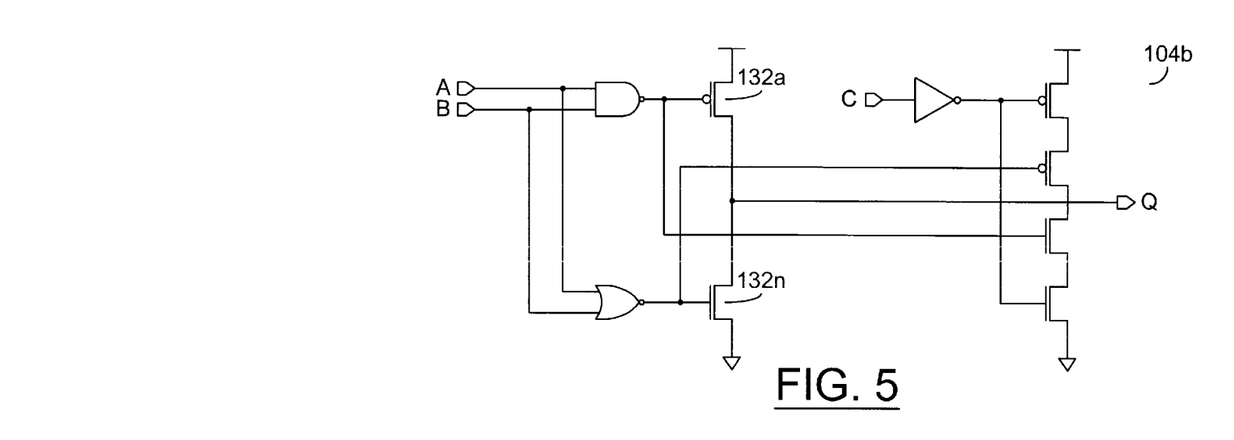
FIG. 5 is a block diagram of another alternate embodiment of the present invention.
Figure 6:
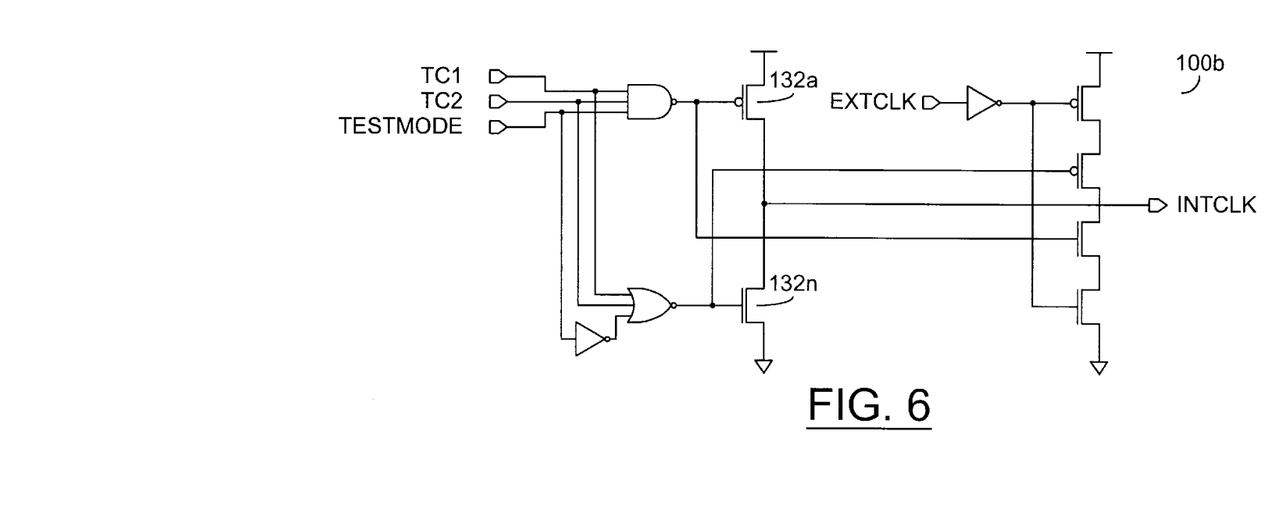
FIG. 6 is a detailed block diagram of an alternate embodiment of the present invention incorporating the circuit of FIG. 5.
Figure 7:
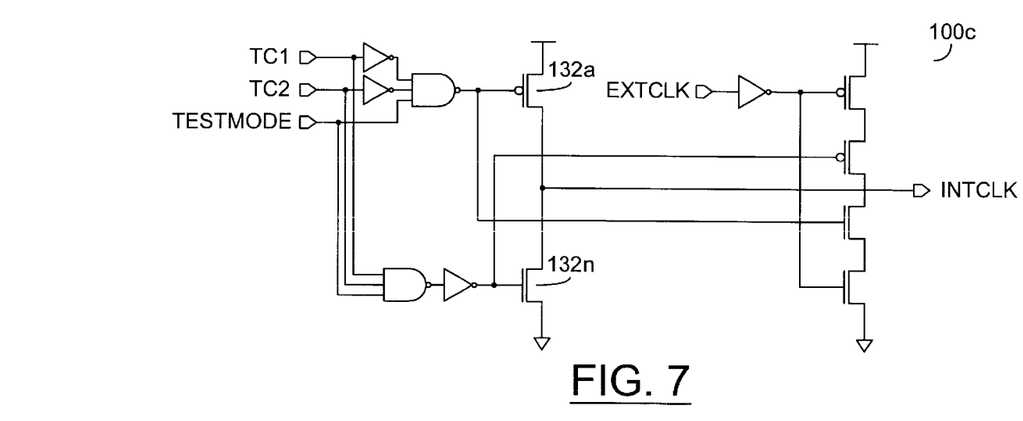
FIG. 7 is a detailed block diagram of an alternate embodiment of the present invention incorporating the circuits of FIGS. 5 and 6.

Referring to FIGS. 5, 6 and 7, a detailed block diagram of a circuit 104b is shown in accordance with an alternate embodiment of the present invention. The majority vote circuit 104b is shown comprising a number of tristate drivers 132a–132n. The tristate drivers 132a–132n may drive the output Q of the majority vote circuit 104b. The normal mode clock of the majority vote circuit 104b may have a single signal path to the output Q.

Referring to FIG. 5, a number of tristate drivers are generally implemented to create the majority vote circuit 104b. The external clock EXTCLK (input C) may be implemented to clock the output Q in both the normal and test modes. Referring to FIG. 6, a circuit 100b is shown. The circuit 100b may allow gating of the test clock TC1 and the test clock TC2 with the signal TESTMODE to be combined with the majority vote circuit 104b in order to reduce an overall gate count. Referring to FIG. 7, a circuit 100c is shown, The circuit 100c may provide improved timing between the external clock EXTCLK and the internal test clock INTCLK when the signal TESTMODE is low. Additionally, the circuit 100c may allow swapping of the P and N transistors.

Figure 8:
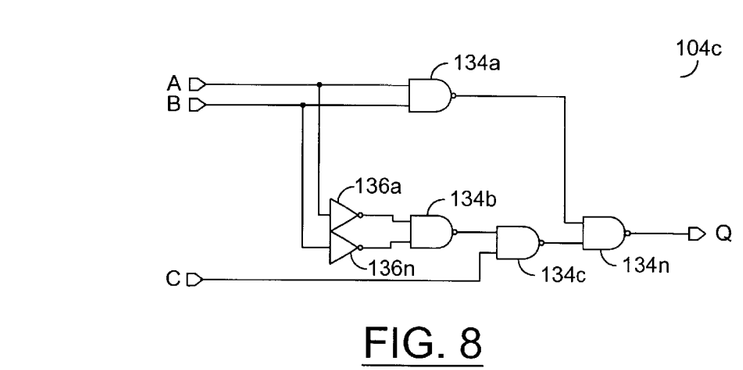
FIG. 8 is a block diagram of another alternate embodiment of the circuit of FIG. 2 illustrating a multi-input circuit.
Figure 9:
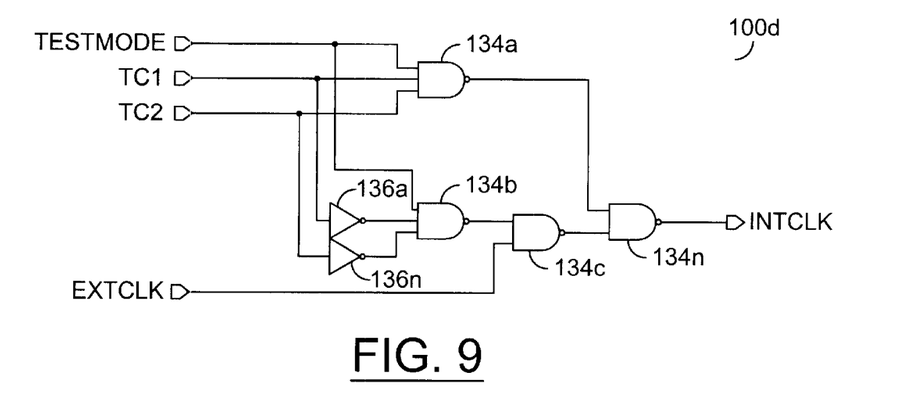
FIG. 9 is a detailed block diagram of an alternate embodiment of the present invention incorporating the circuit of FIG. 8.

Referring to FIGS. 8 and 9, a circuit 104c is shown in accordance with an alternate embodiment of the present invention. The majority vote circuit 104c is shown comprising a number of NAND logic gates 134a–134n and a number of inverter logic gates 136a–136n. The normal mode clock of the majority vote circuit 104c may have a single signal path to the output Q (e.g., though the NAND logic gates 134c–134n).

Referring to FIG. 8, the NAND gates 134a–134n are generally implemented to create the majority vote circuit 104c. The NAND gates 134a–134n may be implemented in a cascaded configuration. Referring to FIG. 9, a circuit 100d is shown. The circuit 100d may allow gating of the test clock TC1 and the test clock TC2 with the signal TESTMODE to reduce an overall gate count.

Figure 10:
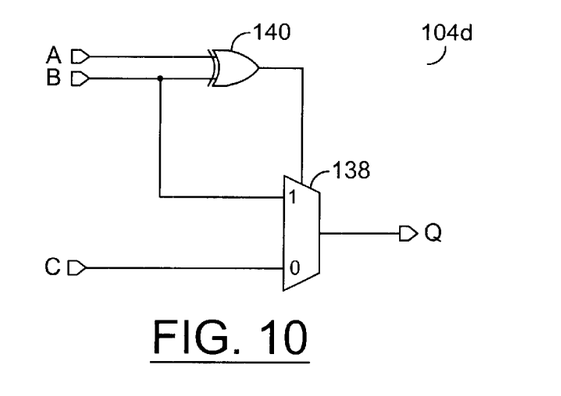
FIG. 10 is a block diagram of an alternate embodiment of a multi-input circuit of FIG. 2.
Figure 11:
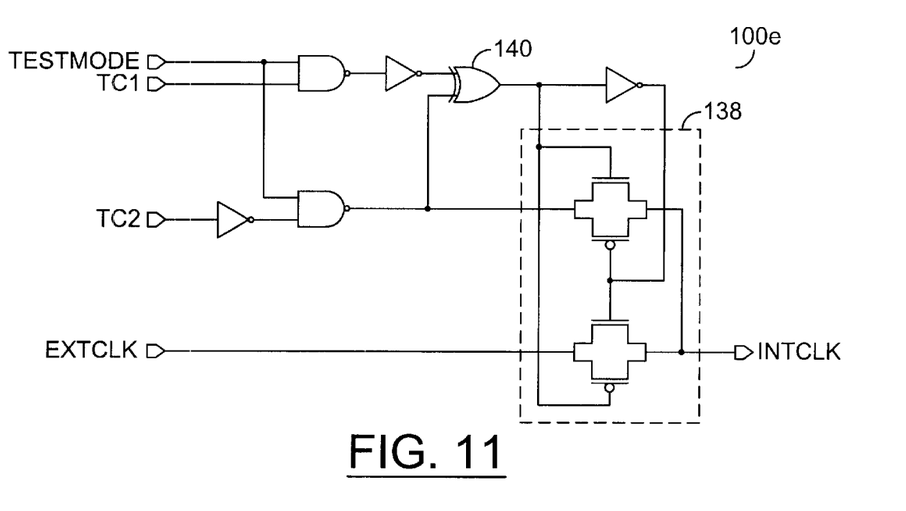
FIG. 11 is a detailed block diagram of an alternate embodiment of the present invention incorporating the circuit of FIG. 10.
Figure 12:
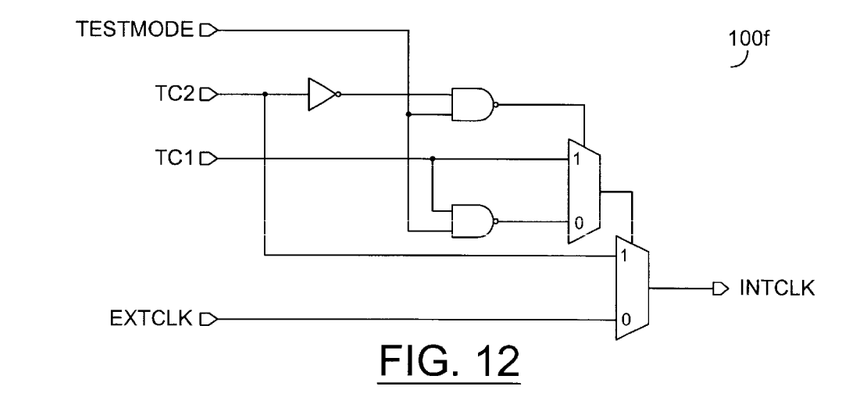
FIG. 12 is a detailed block diagram of an alternate embodiment of the present invention incorporating the circuit of FIGS. 10 and 11.

Referring to FIGS. 10, 11 and 12, a circuit 104d is shown in accordance with an alternate embodiment of the present invention. The majority vote circuit 104d is shown comprising a multiplexer 138 and an exclusive OR logic gate 140. The multiplexer 138 may be controlled by the exclusive OR logic gate 140. The normal mode clock of the majority vote circuit 104d may be connected to a first input of the multiplexer 138, that may provide a single signal path from the normal mode clock (e.g., input C of the clock EXTCLK) to the output Q.

Referring to FIG. 10, the exclusive OR gate 140 may control the multiplexer 138 to create the majority vote circuit 104d. Referring to FIG. 11, surrounding circuitry for a clock multiplication circuit 100e is shown. Referring to FIG. 12, a clock multiplication circuit 100f illustrates an NAND implementation of the majority vote circuit 104d is shown.

Figure 13:
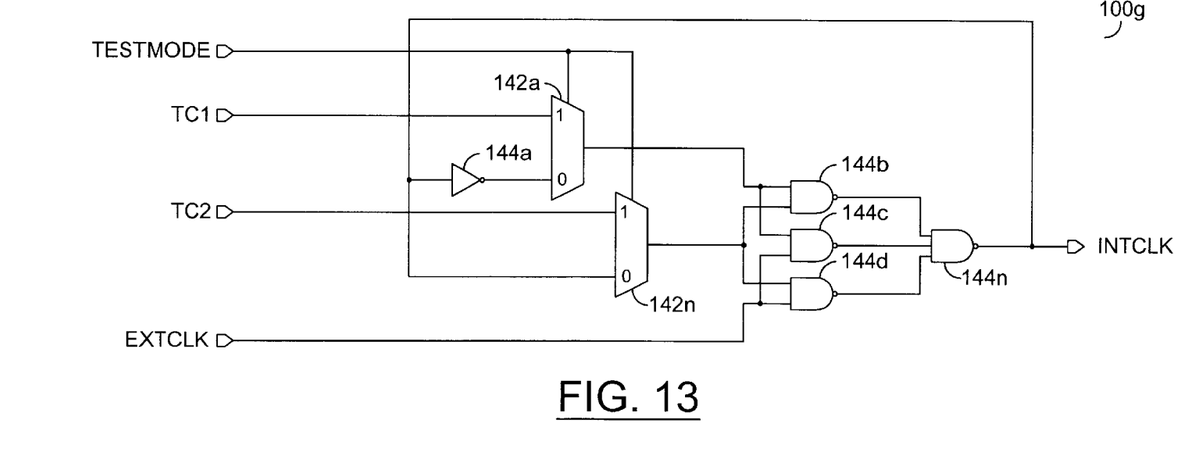
FIG. 13 is a block diagram of another alternate embodiment of the present invention.

Referring to FIG. 13, a circuit 100g is shown illustrating an implementation of the circuit 100 for ignoring short pulses (e.g., glitches or transient undesirable pulses) on an input clock. The circuit 100g generally comprises a number of multiplexers 142a–142n and a number of logic gates 144a–144n. In one example, the circuit 100g may be implemented as a wrapper circuit. The wrapper circuit may be placed around any majority vote circuits 104a–104d as previously described.

A more detailed description of the operation of the clock multiplication circuits 100g will now be described. During the normal mode, the output Q of the majority vote circuit 100g is generally implemented to drive two inputs of the majority vote circuit (e.g., typically one inverted and one not inverted). The inputs to the majority vote circuit, prior to each edge of the clock INTCLK, may be identical in both the normal mode and the test mode. Timing of the clock signal INTCLK to the output of the majority vote circuit may be identical in both the test mode and the normal mode. In the normal mode, when the signal TESTMODE is low, the majority vote output Q may toggle the inputs A and B (e.g., derivations of the test clocks TC1 and TC2) to the majority vote circuit. The inverter delay may swap the edge order of the inputs A and B, relative to the signal TESTMODE, which may prevent oscillation. Additionally, during the normal mode (e.g., the signal TESTMODE is low), the circuit 100 may function as a glitch filter. During the test mode (e.g., the signal TESTMODE is high), the circuit 100g may function as a normal majority vote circuit.

Figure 14:
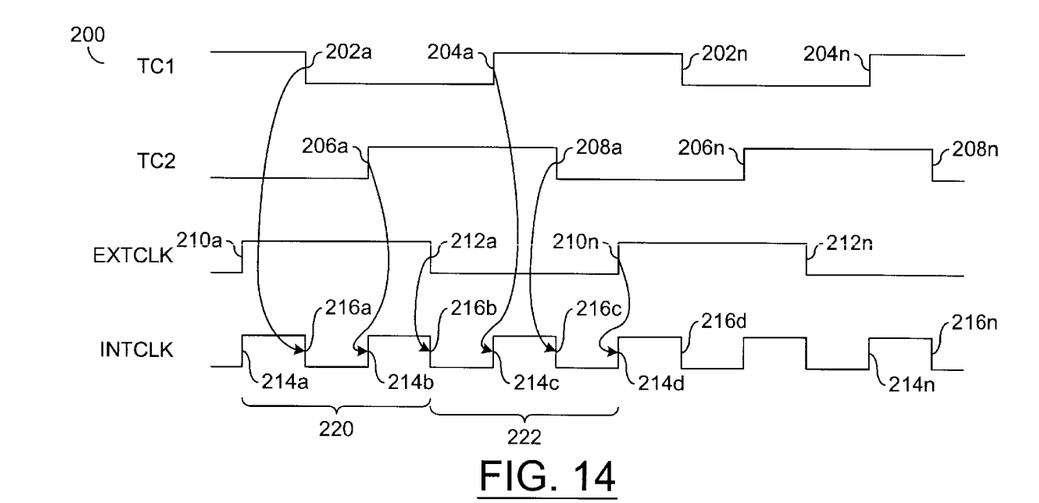
FIG. 14 is a timing diagram illustrating an operation of the present invention.

Referring to FIG. 14, a timing diagram 200 illustrating an operation of the present invention is shown. The signal TC1 is shown having a number of negative transitions 202a–202n and a number of positive transitions 204a–204n. Similarly, the clock signal TC2 may have a number of positive transitions 206a–206n and a number of negative transitions 208a–208n. The signal EXTCLK is shown having a number of positive transitions 210a–210n and a number of negative transitions 212a–212n. The signal INTCLK is shown having a number of positive transitions 214a–214n and a number of negative transitions 216a–216n. The transition 214a generally responds to the positive transition 210a of the signal EXTCLK. The negative transition 216a generally responds to the negative transition 202a of the signal TC1. The positive transition 214b generally responds to the positive transition 206a of the signal TC2. The negative transition 216b generally responds to the negative transition 212a of the signal EXTCLK. As a result, the signal INTCLK may have a frequency that is three times the frequency of the signal EXTCLK.

In general, during a first period 220 of the signal INTCLK, the signal INTCLK may respond as previously described. During a next period 222, the signal INTCLK generally responds to opposite transitions of the signals TC1, TC2 and EXTCLK. In particular, the positive transition 214c generally responds to the positive transition 204a of the signal TC1. The negative transition 216c generally responds to the negative transition 208a of the signal TC2 and the positive transition 214d generally responds to the positive transition 210n of the signal EXTCLK. In general, the high portions of the signal INTCLK occur when two or more of the signal TC1, TC2 and EXTCLK are high (e.g., a majority vote). The low portions of the signal INTCLK occur when two or more of the signals TC1, TC2 and EXTCLK are low (e.g., a majority vote). The circuit 100 may control all edges of the clock INTCLK in response to the signals TC1, TC2 and EXTCLK when in the test mode.

Figure 15:
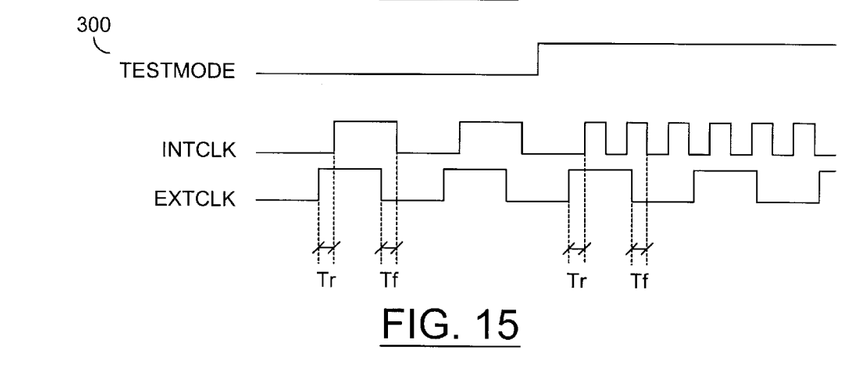
FIG. 15 is a timing diagram illustrating an operation of the present invention.

Referring to FIG. 15, a timing diagram 300 is shown illustrating rise and fall edge delay times of the circuit 100. The timing diagram 300 may illustrate a delay time of rising and falling edges of the clock signal INTCLK to the clock signal EXTCLK, while in the normal and the test modes of operation. In one example, the normal mode may be implemented when the signal TESTMODE is low and the test mode may be implemented when the signal TESTMODE is high. A rising edge delay time (e.g., Tr) of the signal INTCLK may be identical (or nearly identical) in both the normal mode and test mode of the circuit 100. Additionally, a falling edge delay time (e.g., Tf) of the signal INTCLK may be identical (or nearly identical) in both the normal mode and test mode of the circuit 100.

Additionally, the clock multiplication circuits of FIGS. 6 and 7 may implement alternative logic functions. However, the circuits of FIGS. 6 and 7 may require a single signal path from the normal mode clock to the majority vote circuit output. The circuits 104a–104b of FIGS. 4 and 5 and the circuits 100b–100c of FIGS. 6 and 7 may be modified to active low, by changing the NAND logic gates to NOR logic gates and applying DeMorgan's theorem. Additionally, the circuits 104a–104b of FIGS. 4 and 5 and the circuits 100b–100c of FIGS. 6 and 7 may be extended to implement odd numbers of inputs greater than three to achieve higher clock multiplication schemes. For example, a five-input circuit may result in an internal clock running at five times (e.g., 5×) the frequency of the external clocks.

The test mode clock multiplication circuits as described, may guarantee by design that the external clock input C (EXTCLK) to internal clock output Q (INTCLK) timing is independent of the input A test clock (TC1) provided that the input B test clock (TC2) is generally the inverse of the test clock input A (TC1).

Identical (or nearly identical) timing of the external clock EXTCLK to the internal clock INTCLK delay in normal and test modes may be guaranteed by the circuit 100. However, the circuit 100 may not depend upon device matching. The circuit 100 may have a minimal impact on the external clock EXTCLK to the internal clock INTCLK delay when compared to simple clock buffer circuits.

The circuit 100 may reduce a required input clock frequency of a test clock generator, while maintaining control over all internal clock edges via the input clocks and/or signals. In one example, the circuit 100 may provide a three input majority vote circuit that may provide a delay from a clock input to a clock output that may be independent of the state of the first input provided that the second input is generally the inverse of the first input. The circuit 100 may provide a majority vote circuit with identical timing from a single input to an output when the input carries a deciding vote. The circuit 100 may provide a multiple input majority vote circuit with the property that the delay from one of the inputs to the output is independent of the state of the other inputs, provided that a predetermined portion (e.g., half) of the other inputs are at a logic high and a predetermined portion (e.g., half) are at a logic low. The circuit 100 may provide timing from an input that is generally independent of other inputs provided that the number of inputs that may be high is generally equal to the number of inputs that may be low. The majority vote circuit may have an output delay equal to a propagation delay of the circuit 100.

The circuit 100 may provide external control (e.g., the signals TC1, TC2 and EXTCLK) over all edges of the internal clock INTCLK in the test mode. The circuit 100 may allow all clock inputs in a test mode to be correlated with the clock inputs in the normal mode. The circuit 100 may be highly valuable for reducing production costs by enabling the testing of fast parts using slow testers. The circuit 100 may allow testing of any synchronous device using cheaper testers. The circuit 100 may provide timing of critical majority vote circuits where the input transition order is known.

The majority vote circuit 104 may allow timing to be identical for internal and external clocks when in the normal mode. The timing of every edge of the signal INTCLK is generally controllable from the inputs A, B and C. However, the signal TESTMODE does not typically change the normal mode clock input path from the input C (e.g., the signal EXTCLK to the signal INTCLK). Additionally, the path from the external clock to the internal clock may be identical in both the normal and test modes. During the normal mode of the inputs to the majority vote circuit may be forced to different logic values, such that the third input (e.g., the external clock EXTCLK) may provide the deciding vote.

The circuit 100 may allow timing (e.g., setup and hold times) relative to the signal EXTCLK that may be identical in the normal mode and the test mode. The relative delay of the test clock signal TC1 to the clock signal INTCLK and the test clock signal TC1 to the clock signal EXTCLK may be calculated from timings relative to the test clock signal TC1 and to the clock signal INTCLK. Similarly, timings relative to the test clock signal TC2 may be calculated. Thus, by changing the timing of the signals TC1 and TC2, essentially identical timing of the signal INTCLK may be generated for both the test mode and the normal mode.

During the test mode, the external clock input may be correlated with the normal mode clock input. It may be demonstrated that the timing from the normal mode clock input to the internal clock is generally the same in the normal and test modes by measuring a predetermined timing parameter. For example, a setup time in the normal mode and in the test mode may be calculated and compared. The difference in the measured values may be the difference between the two clock path delays. The calculations may then be repeated for the other test mode external clocks. The test mode external clock edges may then be advanced or delayed by the measured differences to provide a near constant internal clock frequency.

The circuit 100 may be highly valuable for reducing production costs by enabling the testing of fast parts by allowing implementations of existing testers. The circuit 100 may allow implementation of cheaper production test equipment by reducing the required external clock frequency by a predetermined factor. The circuit 100 may provide external control over all edges of the internal clock in the test mode. The circuit 100 may have the same control of internal clock high and low times in the normal mode and the clock multiplying test mode. All clock inputs in the test mode may be correlated with the clock inputs in the normal mode. The circuit 100 may provide a majority vote circuit to generate a higher frequency clock. The circuit 100 may provide identical paths for one clock input in the normal and the test modes.

The circuit 100 may allow a reduce required input clock frequency. The circuit 100 may reduce the required tester clock frequency, while maintaining control over all internal clock edges. The circuit 100 may generate a higher frequency clock while maintaining control over all edges of the higher frequency clock. The circuit 100 may generate a higher frequency clock from multiple clocks running at the same lower frequency having different phases. The circuit 100 may generate a higher frequency clock without using delay circuits to control pulse widths of the higher frequency clock.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A circuit configured to generate an output clock signal having (i) a first frequency operating at an odd multiple of a frequency of an input signal when in a first mode and (ii) a second frequency operating at said frequency of said input signal when in a second mode, wherein (a) a delay between said output clock signal and said input signal is essentially identical when operating in either said first mode or said second mode and (b) said output clock signal is generated in response to (i) said input signal and a plurality of test clocks when in said first mode and (ii) said input signal when in said second mode.

2. The circuit according to claim 1, wherein a rise and fall edge delay time of said output clock signal is essentially identical in said first and second modes.

3. The circuit according to claim 1, wherein said first mode comprises a test mode and said second mode comprises a normal mode.

4. The circuit according to claim 1, wherein said first frequency comprises a higher frequency than said second frequency.

5. The circuit according to claim 1, wherein each of said plurality of test clocks and said input signal are phase shifted with respect to each other.

6. The circuit according to claim 1, wherein said first frequency is three times said second frequency.

7. The circuit according to claim 1, wherein said circuit is further configured to provide an essentially identical signal path for said output clock signal when operating in either said first or second mode.

8. The circuit according to claim 7, wherein one or more rising and falling edges of said output clock signal are correlated between said first and second modes.

9. The circuit according to claim 1, wherein said circuit is further configured to match one or more rising and falling edges of said output clock signal between said first and second modes.

10. The circuit according to claim 1, wherein said input signal comprises an external clock signal.

11. The circuit according to claim 10, wherein said input signal comprises a test clock signal.

12. The circuit according to claim 1, wherein said circuit is further configured to determine said first and second modes in response to a test mode signal.

13. The circuit according to claim 1, wherein said circuit is further configured to determine said first and second modes in response to a mode indication signal.

14. The circuit according to claim 1, wherein said circuit is further configured to control one or more clock edges of said output clock signal.

15. The circuit according to claim 1, wherein each of said plurality of test clocks have a different phase.

16. The circuit according to claim 1, further comprising one or more gates configured to receive a second plurality of signals.

17. The circuit according to claim 1, wherein said circuit comprises a clock multiplication circuit.

18. A method for generating an output clock signal comprising the steps of:

(A) receiving an input signal having a frequency;

(B) generating a first output clock signal operating at an odd multiple of said frequency of said input signal when in a first mode; and (C) generating a second output clock signal operating at said frequency of said input signal when in a second mode, wherein (a) a delay of said first and second output clock signals with respect to said input signal is essentially identical and (b) said first output clock signal is generated in response to said input signal and a plurality of test clocks and said second output clock signal is generated in response to said input signal.

19. The method according to claim 18, further comprising the step of:

generating said first output clock signal and said second output clock signal having essentially identical rising and falling edge delays with respect to said input signal.

* * * * *